United States Patent [19]

Sonobe

[11] Patent Number: 5,393,705

[45] Date of Patent: Feb. 28, 1995

[54] MOLDED SEMICONDUCTOR DEVICE USING INTERMEDIATE LEAD PATTERN ON FILM CARRIER FORMED FROM LATTICE PATTERN COMMONLY AVAILABLE FOR DEVICES AND PROCESS OF FABRICATION THEREOF

[75] Inventor: Kaoru Sonobe, Tokyo, Japan

[73] Assignee: NEC Corporation, Tokyo, Japan

[21] Appl. No.: 200,576

[22] Filed: Feb. 22, 1994

Related U.S. Application Data

[62] Division of Ser. No. 985,191, Dec. 3, 1992, abandoned.

[30] Foreign Application Priority Data

Dec. 3, 1991 [JP] Japan .................................. 3-318295

[51] Int. Cl.6 ............................................. H01L 21/60
[52] U.S. Cl. .................................... 437/217; 437/209; 437/214; 437/219; 437/220
[58] Field of Search ............... 257/675, 737, 735, 668, 257/673, 668; 437/209, 214, 211, 217, 215, 220, 226, 216

[56] References Cited

U.S. PATENT DOCUMENTS

| 3,855,693 | 12/1974 | Umbaugh | 29/626 |
|---|---|---|---|
| 4,369,458 | 1/1983 | Thomas et al. | 357/30 |
| 4,801,992 | 1/1989 | Golubic | 437/226 |
| 5,028,983 | 7/1991 | Bickford et al. | 357/69 |
| 5,073,817 | 12/1991 | Ueda | 357/81 |
| 5,138,430 | 8/1992 | Gow, 3rd et al. | 437/217 |
| 5,162,265 | 10/1992 | Roth | 437/217 |
| 5,168,345 | 12/1992 | Brossart | 257/676 |
| 5,205,036 | 4/1993 | Yamazami | 437/217 |
| 5,234,866 | 8/1993 | Okinaga et al. | 437/217 |
| 5,304,843 | 9/1994 | Takubo et al. | 437/217 |

*Primary Examiner*—Brian E. Hearn
*Assistant Examiner*—Kevin M. Picardat
*Attorney, Agent, or Firm*—Sughrue, Mion, Zinn, Macpeak & Seas

[57] ABSTRACT

A molded semiconductor device comprises a semiconductor chip mounted on an island portion, and external leads coupled with ball pumps on the semiconductor chip by means of a conductive leads patterned on a film carrier, and the conductive leads are formed from a conductive lattice pattern on the film carrier available for other molded devices by selectively cutting the conductive lattice pattern with, for example, a laser beam generator, thereby reducing the production cost.

3 Claims, 5 Drawing Sheets

MOLDED SEMICONDUCTOR DEVICE USING INTERMEDIATE LEAD PATTERN ON FILM CARRIER FORMED FROM LATTICE PATTERN COMMONLY AVAILABLE FOR DEVICES AND PROCESS OF FABRICATION THEREOF

This is a divisional of application Ser. No. 07/985,191, filed Dec. 3, 1992, abandoned.

FIELD OF THE INVENTION

This invention relates to a molded semiconductor device and, more particularly, to an intermediate lead pattern on a film carrier for interconnecting a semiconductor chip and external leads.

DESCRIPTION OF THE RELATED ART

A typical example of the molded semiconductor device is illustrated in FIGS. 1 and 2, and largely comprises a semiconductor chip 1, a lead frame 2, a conductive lead pattern 3a patterned on a film carrier 3b, and a plastic molded package 4. The conductive lead pattern 3a on the film carrier 3b is used in a tape automated bonding process, and is hereinbelow referred to as a "TAB lead pattern".

An integrated circuit is fabricated in the semiconductor chip 1, and a plurality of pads are provided on the upper surface of the semiconductor chip 1. The plurality of pads are coupled with the integrated circuit, and allow the integrated circuit to communicate with an external electric system. Ball bumps 1a are formed from a thin gold wire through a thermocompression bonding process, and project from the upper surfaces of the pads.

The lead frame 2 comprises an island portion 2a supported by support pins 2b, and external leads 2c. The semiconductor chip 1 is mounted on the island portion 2a, and is bonded thereto by means of a silver paste film 5. The external leads 2c are arranged around the island portion 2a, and are electrically isolated from the island portion 2a.

The TAB lead pattern 3a is implemented by a plurality of conductive leads electrically isolated from one another, where the conductive leads are coupled at their inner ends with ball bumps 1a and at their outer ends with external leads 2c. The film carrier 3b is formed of polyimide, and prevents the plurality of conductive leads from undesirable deformation in the inner lead bonding stage and the outer lead bonding stage.

The semiconductor chip 1 on the island portion 2a and the TAB lead pattern 3a on the film carrier 3b are sealed in the plastic molded package 4, and the external leads 2c partially project from the plastic molded package 4. The structure thus constructed is desirable for small sized semiconductor chips with a large number of pads, and is called a QFP (Quad Flat Package).

In an assembling process, the TAB lead pattern 3a is previously tailored by the manufacturer, and, for this reason, the TAB lead pattern 3a is not useable for molded semiconductor devices different in location and number of external leads from the molded semiconductor device shown in FIGS. 1 and 2. When the TAB lead pattern 3a is tailored on the film carrier, the manufacturer assembles the semiconductor chip 1, the lead frame 2 and the TAB lead pattern 3a.

A problem encountered in the prior art molded semiconductor device is the high production cost. Particularly, when the pads are arranged at extremely small intervals on a semiconductor chip, the manufacturer must tailor the TAB lead pattern 3a at extremely small intervals, and the conductive leads must be exactly patterned correspondingly on the film carrier 3b. However, such a complex design work consumes time and labor, and the precise patterning increases the production cost. If the molded semiconductor device has a large number of models slightly different in the external lead arrangement such as, for example, gate arrays produced from the same master slice, the manufacturer must tailor each individual TAB lead pattern 3a separately, and the problem becomes especially serious.

SUMMARY OF THE INVENTION

An important object of the present invention to provide a molded semiconductor device the production cost of which is low.

Another important object of the present invention is to provide a process for fabricating the molded semiconductor device.

To accomplish these objects, the present invention uses intermediate conductive leads fashioned from a conductive lattice pattern adaptable for use in numerous other devices with different final TAB lead patterns.

In accordance with one aspect of the present invention, there is provided a molded semiconductor device comprising: a) a semiconductor chip having an integrated circuit fabricated therein, and terminals coupled with the integrated circuit for communicating with an external electric system; b) a lead frame having an island portion for mounting the semiconductor chip, and external leads provided around the island portion; c) intermediate conductive leads patterned on a film carrier, and interconnecting the terminals and the external leads, the intermediate conductive leads being patterned from a conductive lattice pattern on the film carrier by selectively cutting the lattice pattern; and d) a molded package sealing the semiconductor chip on the island and the intermediate conductive leads, and allowing the external leads partially projecting therefrom.

In accordance with another aspect of the present invention, there is provided a process of fabricating a molded semiconductor device comprising the steps of: a) preparing a conductive lattice patterned on a film carrier, a semiconductor chip, and a lead frame having an island portion and external leads; b) selectively cutting the conductive lattice so as to form intermediate conductive leads on the film carrier; c) coupling the intermediate conductive leads with terminals of the semiconductor chip mounted on the island portion and with the external leads; and d) molding the semiconductor chip on the island portion and the intermediate conductive leads on the film carrier in molding material, the external leads partially projecting from the molding material.

BRIEF DESCRIPTION OF THE DRAWINGS

The features and advantages of the molded semiconductor device and the process of fabrication thereof according to the present invention will be more clearly understood from the following description taken in conjunction with the accompanying drawings in which.

DESCRIPTION OF THE PREFERRED EMBODIMENTS

First Embodiment

Figure 1:
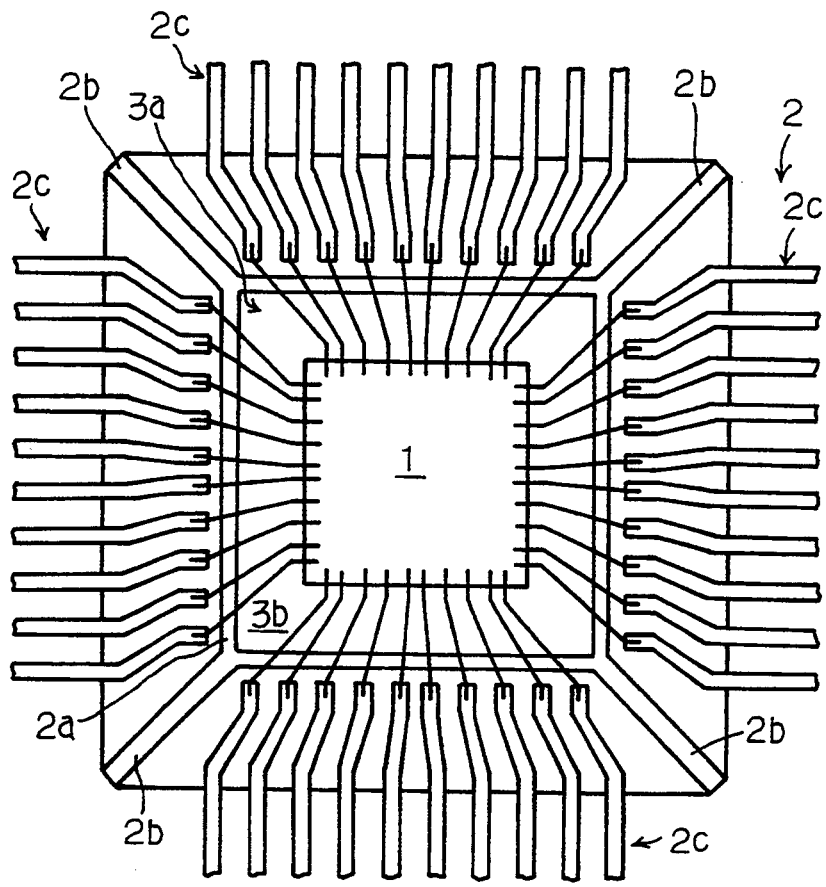
FIG. 1 is a plan view showing the prior art lead pattern for coupling the semiconductor chip with the external leads.
Figure 2:
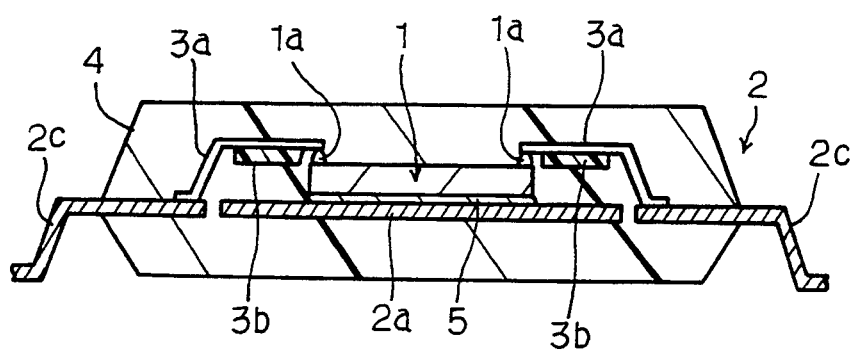
FIG. 2 is a cross sectional view showing the structure of the prior art molded semiconductor device.
Figure 3:
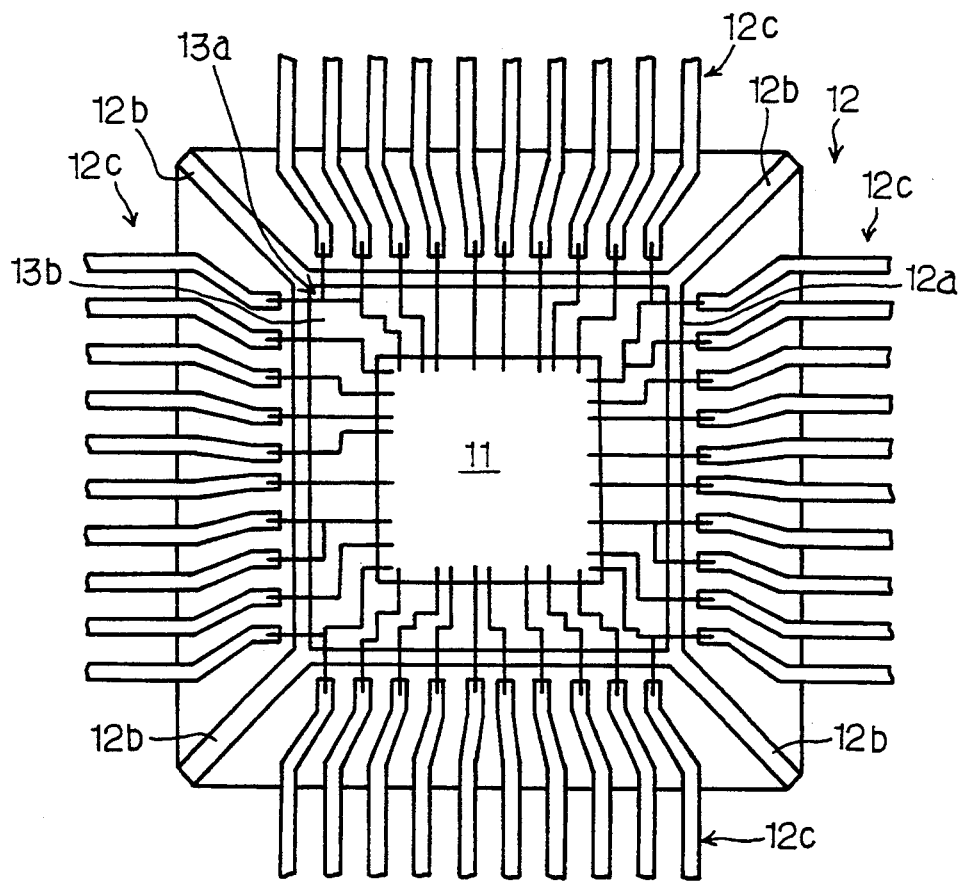
FIG. 3 is a plan view showing a conductive lead pattern for coupling a semiconductor chip with external leads according to the present invention.
Figure 4:
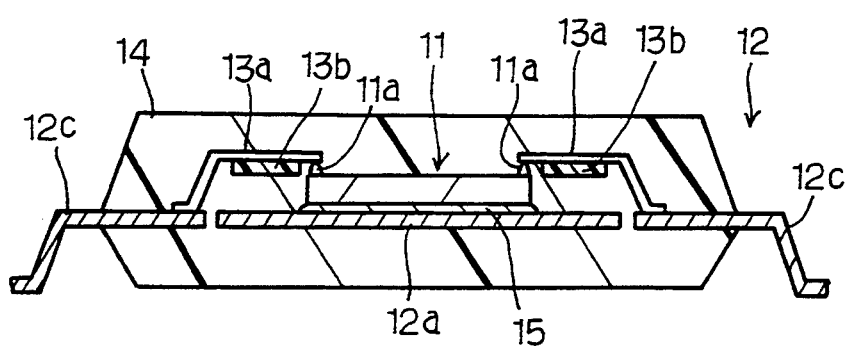
FIG. 4 is a cross sectional view showing the structure of a molded semiconductor device according to the present invention.

Referring to FIGS. 3 and 4 of the drawings, a molded semiconductor device embodying the present invention largely comprises a semiconductor chip 11, a lead frame 12, a TAB lead pattern 13a patterned on a film carrier 13b, and a plastic molded package 14.

An integrated circuit is fabricated in the semiconductor chip 11, and a plurality of pads are arranged on the upper surface of the semiconductor chip 11. The plurality of pads are coupled with the integrated circuit, and allow the integrated circuit to communicate with an external electric system. Ball bumps 11a are formed from a thin gold wire through a thermocompression bonding process, and project from the upper surfaces of the pads. The ball bumps 11a serve as terminals of the semiconductor chip 11a.

The lead frame 12 comprises an island portion 12a supported by support pins 12b, and a plurality of external leads 12c. The semiconductor chip 11 is mounted on the island portion 12a, and is bonded thereto by means of a silver paste film 15. Heat is propagated from the semiconductor chip 11 through the silver paste film 15 to the island portion 12a, and is radiated to the outside of the plastic molded package 14. The external leads 12c are arranged around the island portion 12a, and are electrically isolated from the island portion 12a. The external leads 12c are formed of copper, and are 100 microns to 200 microns in thickness. However, the external leads 12c may be formed of iron-nickel alloy. The inner end portion of each external lead 12c is plated, and gold, silver or tin-lead alloy may be used for the plating.

The TAB lead pattern 13a is implemented by means of a plurality of conductive lead sub-patterns, in such a manner that the conductive lead sub-patterns are coupled at their inner ends with ball bumps 11a and at their outer ends with external leads 12c. Each of the conductive lead sub-patterns is formed from copper foil, and is 10 microns to 50 microns in thickness. The outer end of each conductive lead sub-pattern is plated, and gold, silver or tin-lead alloy may be used for the plating. The outer ends thus plated are bonded to the inner ends of the external leads 12c.

Figure 5:
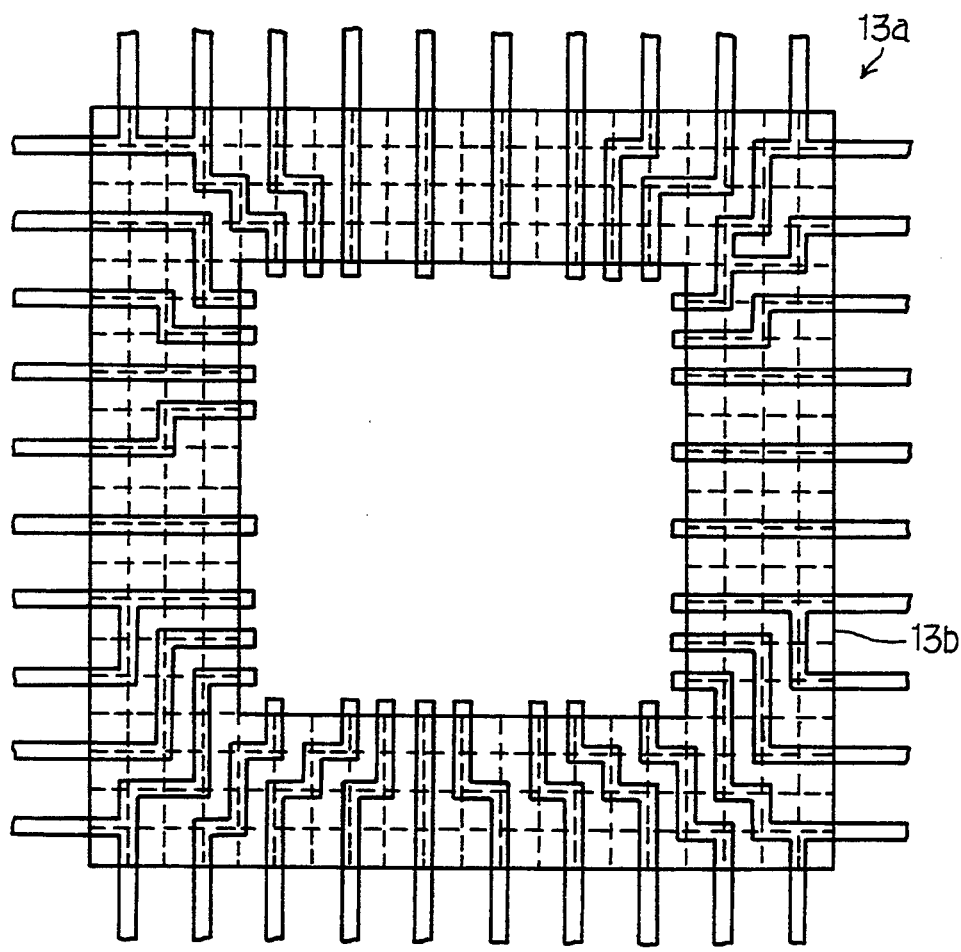
FIG. 5 is a plan view showing a conductive lattice pattern used for creating the conductive lead pattern shown in FIG. 3.

The TAB lead pattern 13a is formed from a conductive lattice pattern as shown in FIG. 5. Broken lines are indicative of the conductive lattice pattern formed on the film carrier 13b, and any disconnection is not incorporated in the conductive lattice pattern. When the TAB lead pattern 13a is determined, the manufacturer selectively breaks the conductive lattice pattern with an appropriate machine or a laser beam generator, so that conductive lead sub-patterns electrically isolated from one another are formed from the remaining conductive lattice pattern. Thus, the TAB lead pattern is formed from the conductive lattice pattern by selectively cutting the lattice, so that a very large number of different possible TAB lead patterns may be formed from the same conductive lead pattern. Thus the same conductive lattice pattern is available for use in making other molded semiconductor devices. This results in reduction of the production cost, and the TAB lead pattern 13a is preferable for gate arrays produced from the same master slice. Moreover, since the conductive lattice pattern is cut to form conductive lead sub-patterns, the inner ends of the conductive lead sub-patterns may be arranged at extremely small intervals. The minimum interval of the prior art ranges between 150 microns and 200 microns. In contrast, the minimum interval between the ball bumps 11a according to the present invention is drastically decreased to 30 microns to 120 microns, and the TAB lead pattern 13a is adaptable to a semiconductor device with a large number of leads. The TAB lead pattern 13a is further adaptable to an integrated circuit fabricated on an elongated semiconductor chip such as a linear charge coupled device, and is more easily connected than when using a wire bonding technology. If the island portion 12a is enlarged, the heat radiation capability is improved regardless of the semiconductor chip size.

Turning back to FIGS. 3 and 4, the film carrier 13b is formed of resin such as, for example, polyimide, and prevents the plurality of conductive leads from undesirable deformation in the inner lead bonding stage and in the outer lead bonding stage. In this instance, the conductive lead sub-patterns serve as intermediate leads, respectively.

The semiconductor chip 11 on the island portion 12a and the TAB lead pattern 13a on the film carrier 13b are sealed in the plastic molded package 14, and the external leads 12c partially project from the plastic molded package 14.

Figure 6A:
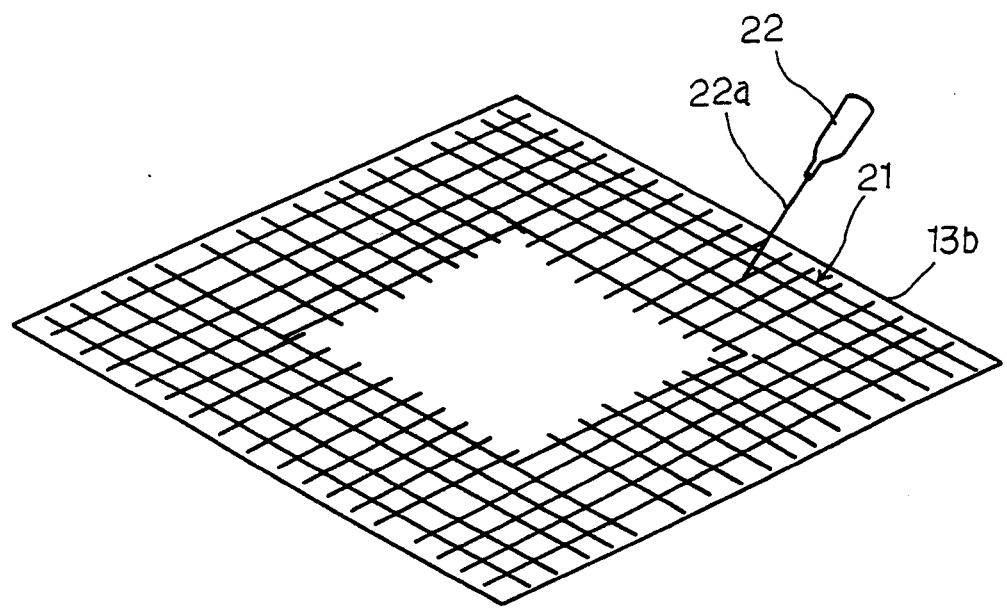
FIGS. 6A to 6C are sectional views showing a process sequence for fabricating the molded semiconductor device according to the present invention.
Figure 6B:
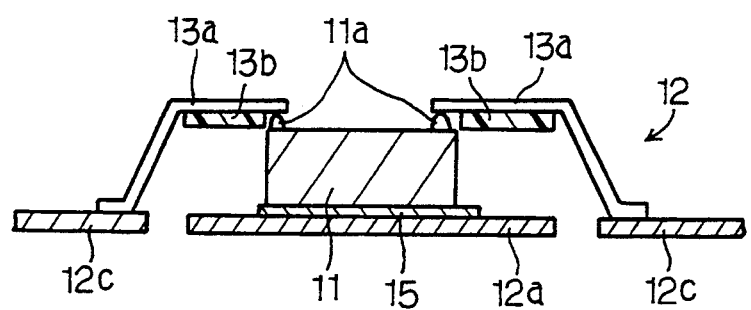

Description is hereinbelow made on a process sequence for fabricating the molded semiconductor device according to the present invention with reference to FIGS. 6A to 6C. The process sequence starts with preparation of a conductive lattice 21 patterned on a film carrier 13b, a semiconductor chip 11, and a lead frame 12. The conductive lattice 21 is selectively cut with a laser beam generator 22 for producing a laser beam 22a as shown in FIG. 6A, and a TAB lead pattern 13a is left on the film carrier 13b.

The TAB lead pattern 13a is coupled with ball bumps produced on the pads of the semiconductor chip 11 mounted on the island portion 12a of the lead frame 12, and is further coupled with the external leads 12c. The resultant structure of this stage is illustrated in FIG. 6B.

Figure 6C:
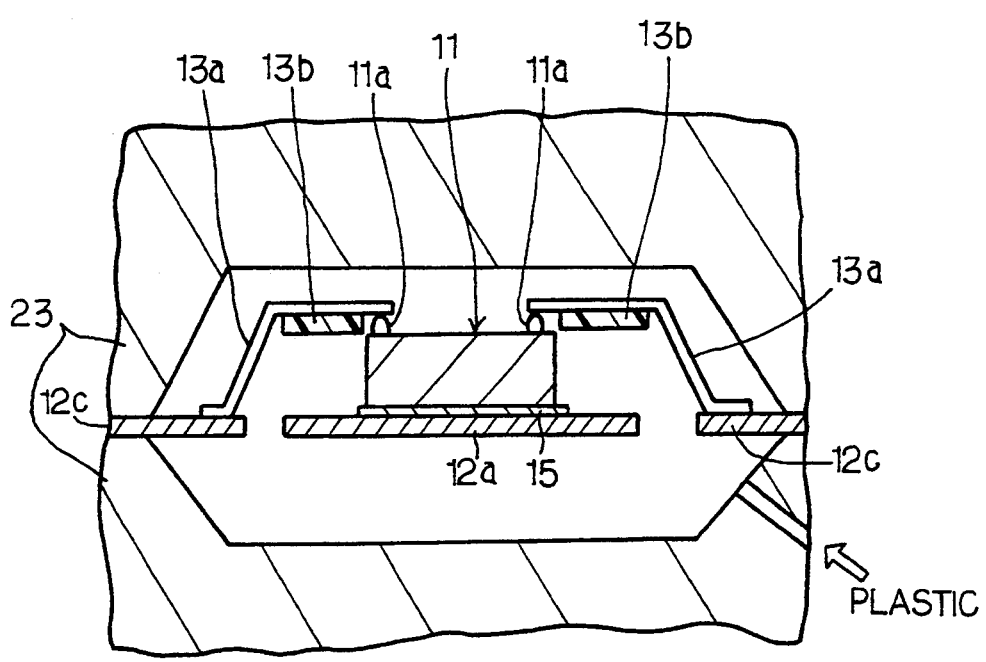

The structure is placed in a mold 23, and melted plastic is injected into a hollow space of the mold 23 as shown in FIG. 6C. As a result, the semiconductor chip 11 on the island portion 12a and the TAB lead pattern 13a on the film carrier 13b are sealed in the plastic package 14, and the external leads 12c partially project from the plastic package 14.

As will be understood from the foregoing description, the molded semiconductor device according to the present invention shares the conductive lattice pattern 21 with other molded semiconductor devices, and the production cost is decreased.

Second Embodiment

Figure 7:
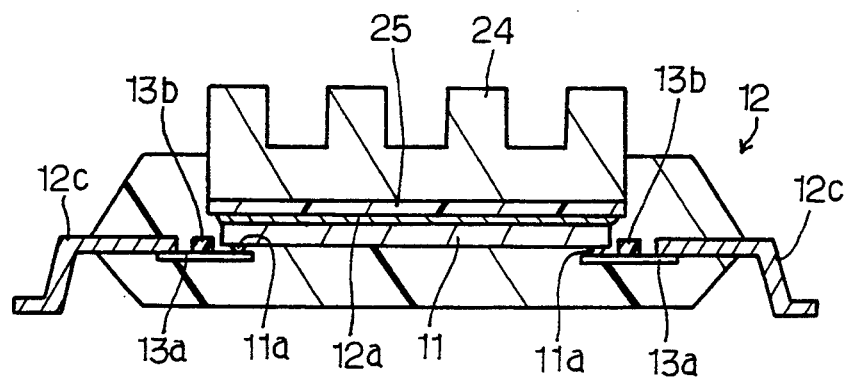
FIG. 7 is a cross sectional view showing the structure of another molded semiconductor device according to the present invention.

Turning to FIG. 7 of the drawings, another molded semiconductor device embodying the present invention is accompanied with a heat sink 24. The other components of the molded semiconductor device are labeled with the same references as those of the first embodiment. The semiconductor chip 11 is bonded to the reverse surface of the island portion 12a, and the TAB lead pattern 13a is coupled at the inner ends thereof with the ball bumps 11a downwardly projecting from the semiconductor chip 11 and at the outer ends thereof with the reverse surfaces of the external leads 12c. The heat sink 24 is bonded to the top surface of the island portion 12a by means of silicon resin 25, and enhances heat radiation capability. Cold air may be blown to the heat sink 24. For this reason, the TAB lead pattern 13a according to the present invention is applicable for a semiconductor chip where a power integrated circuit is fabricated.

Although particular embodiments of the present invention have been shown and described, it will be obvious to those skilled in the art that various changes and modifications may be made without departing from the spirit and scope of the present invention.

What is claimed is:

1. A process of fabricating a molded semiconductor device comprising the steps of:
   a) preparing a conductive lattice patterned on a film carrier, a semiconductor chip, and a lead frame having an island portion and external leads;
   b) selectively cutting said conductive lattice so as to form intermediate conductive leads on said film carrier;
   c) coupling said intermediate conductive leads with terminals of said semiconductor chip mounted on said island portion and with said external leads; and
   d) molding said semiconductor chip on said island portion and said intermediate conductive leads on said film carrier in molding material, said external leads partially projecting from said molding material.

2. A process as set forth in claim 1, in which said conductive lattice is selectively cut by using a laser beam.

3. A process of fabricating a molded semiconductor device comprising the steps of:
   (a) preparing
      a semiconductor chip having an integrated circuit fabricated therein and terminals coupled with said integrated circuit for communicating with an external electric device,
      a lead frame having an island portion for mounting said semiconductor chip and external leads provided around said island portion, and
      a conductive lattice pattern formed on a film carrier;
   b) selectively cutting said conductive lattice pattern so as to form intermediate conductive leads on said film carrier, said intermediate conductive leads being arranged in such a manner as to be aligned with said terminals and said external leads,
   c) connecting said intermediate conductive leads with said terminals and with said external leads, at least some of said intermediate conductive leads being electrically isolated from one another; and
   d) sealing said semiconductor chip on said island portion and said intermediate conductive leads on said film carrier in a molding material in such a manner that said external leads at least partially project therefrom.

* * * * *